(12) United States Patent
Park et al.

(10) Patent No.: US 7,914,194 B2
(45) Date of Patent: Mar. 29, 2011

(54) BACKLIGHT UNIT HAVING LIGHT EMITITNG DIODES AND METHOD OF MANUFACTURING THE SAME

(75) Inventors: Jung Kyu Park, Seoul (KR); Hun Joo Hahm, Gyunggi-do (KR); Chul Hee Yoo, Gyunggi-do (KR); Young June Jeong, Suwon (KR); Young Sam Park, Seoul (KR); Seong Yeon Han, Gwangju (KR)

(73) Assignee: Samsung Led Co., Ltd., Gyunggi-Do (KR)

( * ) Notice: Subject to any disclaimer, the term of this patent is extended or adjusted under 35 U.S.C. 154(b) by 354 days.

(21) Appl. No.: 12/071,836

(22) Filed: Feb. 27, 2008

(65) Prior Publication Data
US 2008/0205058 A1    Aug. 28, 2008

(30) Foreign Application Priority Data
Feb. 27, 2007 (KR) .............. 10-2007-19863

(51) Int. Cl.
*F21V 7/04* (2006.01)
(52) U.S. Cl. .......... 362/613; 362/97.3; 362/633
(58) Field of Classification Search .......... 362/97.3, 362/249.02, 600, 612, 613, 634, 632, 633
See application file for complete search history.

(56) References Cited

U.S. PATENT DOCUMENTS

| | | | | |
|---|---|---|---|---|
| 5,857,767 A | * | 1/1999 | Hochstein | 362/294 |
| 2006/0164858 A1 | | 7/2006 | Park et al. | |
| 2007/0221942 A1 | * | 9/2007 | Jeong et al. | 257/99 |
| 2008/0180621 A1 | * | 7/2008 | Woo et al. | 349/138 |
| 2009/0116222 A1 | * | 5/2009 | Hamada | 362/97.2 |

FOREIGN PATENT DOCUMENTS

| | | |
|---|---|---|
| CN | 201017896 | 2/2008 |
| JP | 2005-115131 | 4/2005 |
| JP | 2006-189519 | 7/2006 |
| KR | 10-2006-0002566 A | 1/2006 |
| KR | 10-2006-0085011 | 7/2006 |
| KR | 10-20070095540 | 10/2007 |

OTHER PUBLICATIONS

Chinese Office Action, with English Translation, issued in Chinese Patent Application No. CN 200810082718.4, dated Jul. 31, 2009.
Korean Office Action, with English Translation, issued in Korean Patent Application No. 10-2007-0019863 Dated Dec. 21, 2007.

* cited by examiner

*Primary Examiner* — John A Ward
(74) *Attorney, Agent, or Firm* — McDermott Will & Emery LLP

(57) ABSTRACT

There is provided a backlight unit including: a chassis having an insulating layer formed on a top thereof; a circuit pattern formed on the insulating layer; a plurality of light emitting diodes formed on the insulating layer to electrically connect to the circuit pattern.

13 Claims, 9 Drawing Sheets

BACKLIGHT UNIT HAVING LIGHT EMITITNG DIODES AND METHOD OF MANUFACTURING THE SAME

CROSS-REFERENCE TO RELATED APPLICATIONS

This application claims the priority of Korean Patent Application No. 2007-0019863 filed on Feb. 27, 2007, in the Korean Intellectual Property Office, the disclosure of which is incorporated herein by reference.

BACKGROUND OF THE INVENTION

1. Field of the Invention

The present invention relates to a backlight unit for a liquid crystal display using a light emitting diode and a manufacturing method thereof, and more particularly, a backlight unit which is significantly decreased in the number of parts such as printed circuit boards (PCBs), connectors for connecting the PCBs having light emitting diodes mounted thereon and structures for fixing the PCBs, and simplified in manufacturing and assembling processes, and a manufacturing method thereof.

2. Description of the Related Art

With a recent trend of greater thinness and higher performance of display devices, liquid displays are widely utilized in TVs and monitors. The liquid display panel does not emit light on its own, thus requiring an additional backlight unit (BLU). A conventional BLU using a cold cathode fluorescent lamp (CCFL) is disadvantageous in terms of mercury-induced environmental pollution, a low response rate and difficulty in partial driving. To overcome these problems, a light emitting diode (LED) has been suggested in place of the CCFL as a BLU light source. This LED-based BLU can achieve high color reproducibility, and is environment-friendly and driven by local dimming.

The BLU includes a direct-type BLU and an edge-type BLU. In the latter, a bar-shaped light source is disposed at an edge of a liquid crystal panel to irradiate light thereonto through a light guide plate. On the other hand, in the former, a surface light source using LEDs is disposed below the liquid crystal panel to directly irradiate light thereonto.

A single LED corresponds to a point light source and has a low luminous flux. Therefore, to produce a direct-type BLU for use in a big LCD-TV, typically, hundreds to thousands of LEDs are mounted on divided PCBs and then attached to a chassis structure. To enhance mechanical stability and radiation properties of the direct-type BLU, parts such as screws and gap pads are required and connectors for electrically connecting the PCBs are necessary.

FIG. 1 schematically illustrates a conventional BLU, in which FIG. 1A is a cross-sectional view and FIG. 1B is a plan view. Referring to FIG. 1, the BLU 10 includes a PCB 21 having a plurality of LEDs 25 mounted thereon, a chassis 11, and other optical sheets 33, such as a diffusion plate 31 and a prism, spaced apart from the PCB 21. A liquid crystal panel 40 is disposed above the BLU to receive white surface light emitted from the BLU 10. The PCBs 21 having the LEDs 25 mounted thereon constitute light source parts of the BLUs.

As shown in FIGS. 1A and 1B, the LEDs 25, i.e., point light sources are mounted on the divided PCBs as chips or in a package. The PCBs 21 are fixed to a bottom chassis (simply, "chassis") 11 of a metal material disposed under the PCBs. To radiate heat emitted from the LEDs 25 smoothly, a gap pad 22 may be interposed between the chassis 11 and the PCBs 21. Engaging units such as a screw are required to fix the PCBs 21 to the chassis 11. Moreover, the divided PCBs 21 may be electrically connected to one another by connectors 23.

To manufacture the conventional BLU 10, the PCBs 21 are fixed to the chassis 11 using engaging units such as a screw. This causes an assembling process to be time-consuming and less efficient. Also, the assembling process for connecting the separate PCBs 21 to one another by connectors requires considerable resources and time. Furthermore, heat generated from the LEDs 25 is radiated outward through the PCBs 21 and the expensive gap pad 22, thereby leading to high material costs and insufficient heat radiation characteristics.

SUMMARY OF THE INVENTION

An aspect of the present invention provides a backlight unit having LEDS which can be assembled easily in a simple manner and is reduced in manufacturing costs including material costs, and increased in radiation efficiency.

An aspect of the present invention also provides a method of manufacturing a backlight unit having LEDs in which the backlight unit can be manufactured in a simpler process, with a shorter time and at a low cost.

According to an aspect of the present invention, there is provided a backlight unit including: a chassis having an insulating layer formed on a top thereof; a circuit pattern formed on the insulating layer; a plurality of light emitting diodes (LEDs) formed on the insulating layer to electrically connect to the circuit pattern.

The backlight unit may further include another insulating layer formed on a bottom of the chassis. The plurality of LEDs may be white LEDs. The plurality of LEDs may include blue, green and red LEDs.

The chassis may be formed of one of aluminum and an aluminum alloy. The insulating layer may be an aluminum anodized layer.

The circuit pattern may be formed of a material containing silver (Ag). The circuit pattern may be formed of a sintered material of silver paste.

According to another aspect of the present invention, there is provided a method of manufacturing a backlight unit, the method including: providing a chassis; forming an insulating layer on a top of the chassis; forming a circuit pattern on the insulating layer; and mounting a plurality of LEDs on the insulating layer to connect to the circuit pattern.

The chassis may be formed of one of aluminum and an aluminum alloy. The forming an insulating layer on a top of the chassis may include anodizing the top of the chassis to form an aluminum anodized layer on the top of the chassis.

The chassis may be formed of one of aluminum and an aluminum alloy. The forming an insulating layer on a top of the chassis may include anodizing the top of the chassis to form an aluminum anodized layer on the top of the chassis. The anodizing may be performed on a bottom of the chassis.

The forming a circuit pattern may include: forming a silver paste on the insulating layer on the top of the chassis; and sintering the silver paste. The forming a silver paste may include applying the silver paste on the insulating layer. Here, the applying the silver paste on the insulating layer may be performed by one of screen printing and ink jet printing.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
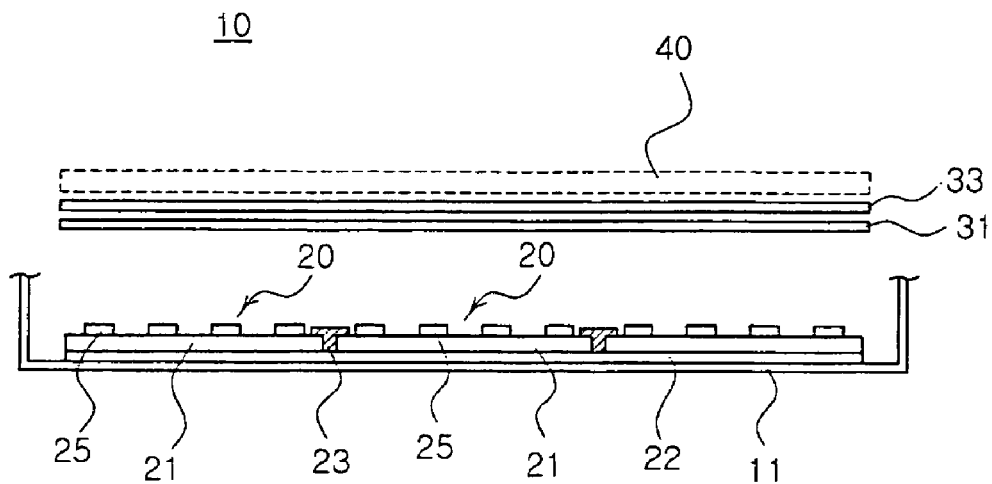
FIG. 1A is a cross-sectional view illustrating a conventional backlight unit using LEDs and FIG. 1B is a plan view illustrating the backlight unit of FIG. 1B.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
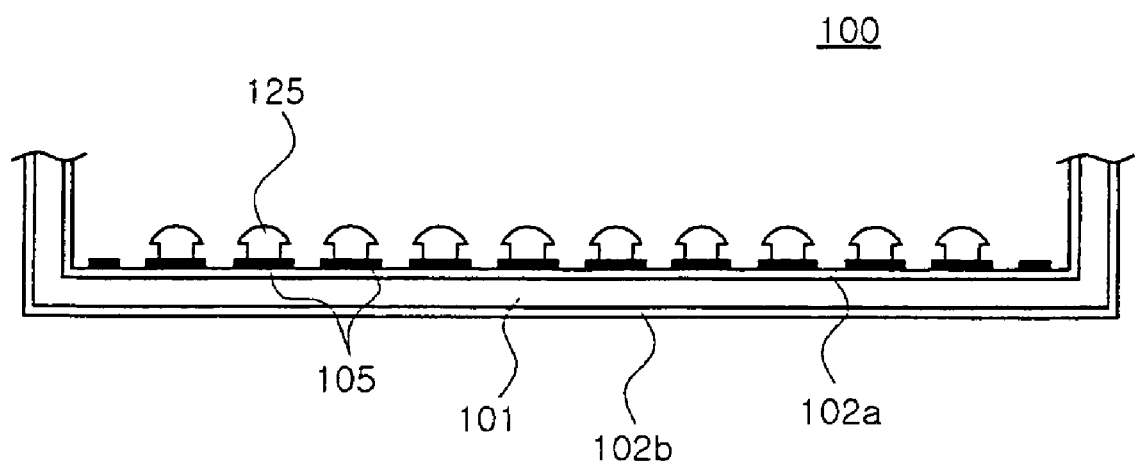
FIG. 2 is a cross-sectional view illustrating a backlight unit according to an exemplary embodiment of the invention.
Figure 3:
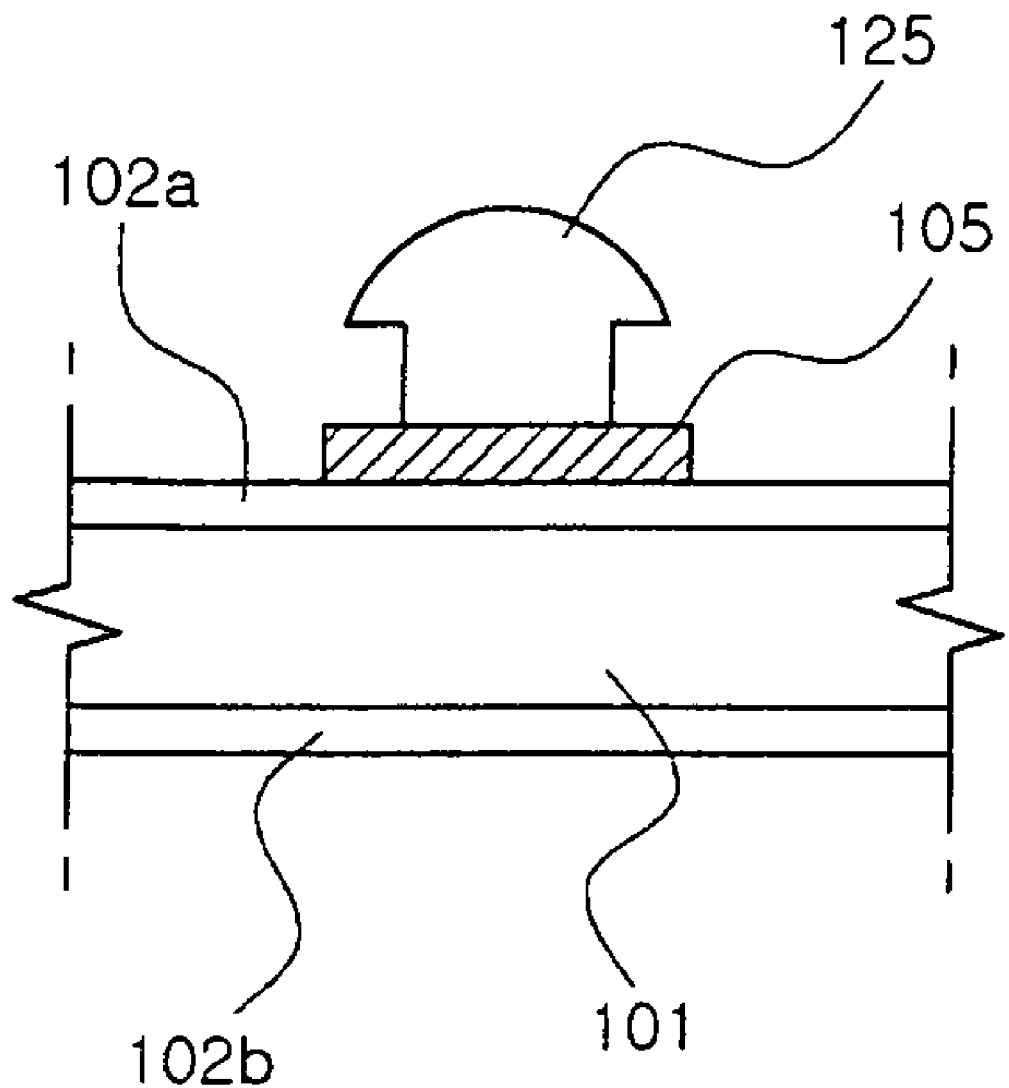
FIG. 3 is a partially magnified view illustrating the backlight unit of FIG. 2.

FIG. 2 is a schematic cross-sectional view illustrating a direct-type backlight unit according to an exemplary embodiment of the invention and FIG. 3 is a partial magnified view of FIG. 2.

Figure 1B:
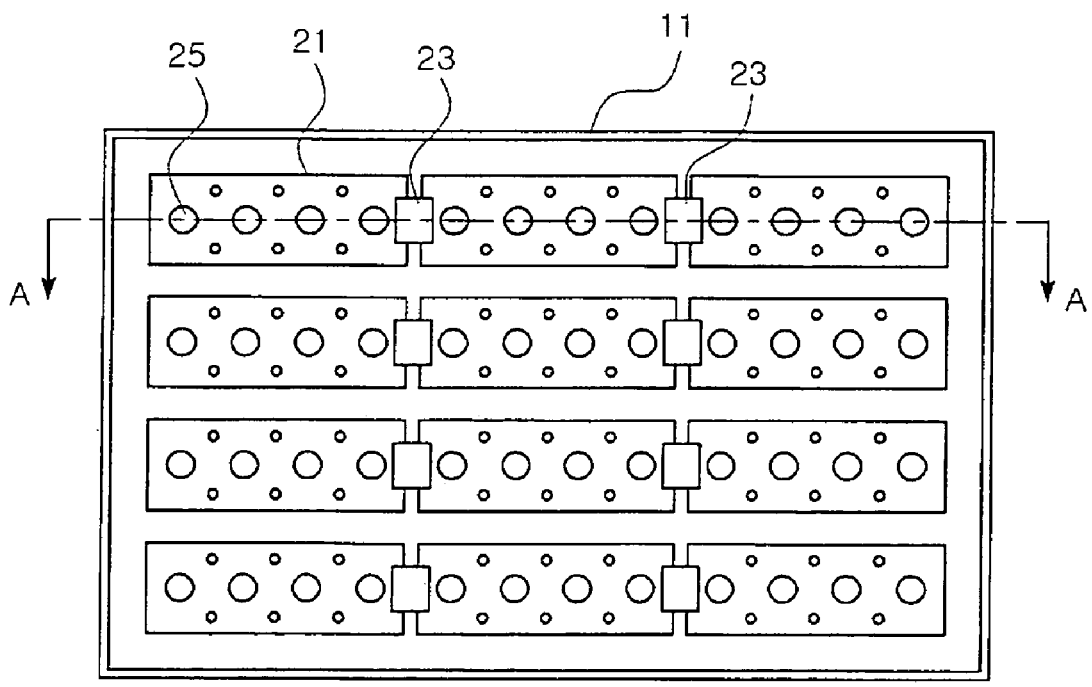

Referring to FIGS. 2 and 3, the backlight unit 100 includes a chassis 101 of a metal material, an insulating layer 102a formed on a top thereof and a plurality of light emitting diodes (LED)s 125 formed on the insulating layer 102a. A conductive circuit pattern 105 is formed on the insulating layer 102a to electrically connect the LEDs 125 to one another. Also, a lower insulating layer 102b is formed on a bottom of the chassis and made of a material identical to or different from the insulating layer 102a. Each of the LEDs 125 constitutes a point light source but the plurality of LEDs 125 arranged can form a surface light source as a whole. As shown, the backlight unit 100 does not include an additional printed circuit board (PCB) having the LEDs mounted thereon, as opposed to FIG. 1. Various optical sheets (not shown) such as a diffusion plate and a prism may be disposed above the LEDs 125 at a predetermined distance from the LEDs 125.

The LEDs 125 may include white LEDs, for example, a combination of blue GaN-based LEDs and a yellow phosphor, a combination of blue GaN-based LEDs with green and red phosphors, or a combination of ultra violet (UV) or near UV LEDs with blue, and green and red phosphors. Alternatively, to produce white output light, the LEDs 125 may include blue LEDs, green LEDs and red LEDs. Each of the LEDs 125 may be mounted in a separate package or mounted by a chip on board (COB) method in which the LED chips are directly mounted on the insulating layer 102a.

The chassis may be made of aluminum Al or an aluminum alloy. The chassis made of Al or an Al alloy can be easily anodized on its surface. This allows the insulating layers 102 and 102b, i.e., anodized aluminum oxide layers to be formed on the top and bottom of the chassis, respectively. However, the insulating layers 102a and 102b applicable to the present invention are limited to the anodized aluminum oxide layers. For example the insulating layers 102a and 102b may adopt other insulators such as polymer like poly imide, and ceramic. Also, the insulating layers may be formed by physical and chemical methods other than anodization.

The conductive circuit pattern 105 electrically connects the LEDs 125 to one another and may be connected to a driving circuit (not shown). The circuit pattern 105 may be formed by e.g., applying a silver Ag paste on the insulating layer 102a and then sintering the silver paste. However, the present invention is not limited thereto. For example, metal circuits may be directly formed on the insulating layer as a way to realize the circuit pattern 105.

In the backlight unit 100, contrary to the conventional backlight unit (see FIG. 1), the circuit pattern is formed directly on the chassis 101 having the insulating layer 102a formed thereon, thus not requiring an additional PCB (see reference numeral 11 of FIG. 1) having the LEDs mounted thereon. This accordingly precludes a need for connectors for connecting the divided PCBs to one another (see reference numeral 23 of FIG. 1) and engaging units such as screw for fixing the PCB to the chassis.

This as a result saves material costs necessary for the PCBS for mounting the LEDs thereon, connectors for connecting the PCBs to one another and engaging units such as a screw, significantly diminishes the number of parts and relatively simplifies a structure. Moreover, heat generated from the LEDs 125 is directly transferred to the broad chassis 105 of a metal material through the insulating layer 102a, thus noticeably improving heat radiation properties. Conventionally, heat is radiated below the chassis from the LEDs through a structure such as the PCB and gap pad, thereby not ensuring sufficient heat radiation. However, according to the present embodiment, the parts blocking heat radiation are not employed and heat is directly transferred to the chassis made of a heat conductive material, e.g., aluminum or alloy thereof. This ensures much superior radiation characteristics to the conventional backlight unit. Moreover, in the manufacturing process of the BLU 100, there is no a need for an assembling process for fixing the PCB. This considerably simplifies the manufacturing process of the BLU, thereby reducing labor costs necessary for assembling.

Figure 4:
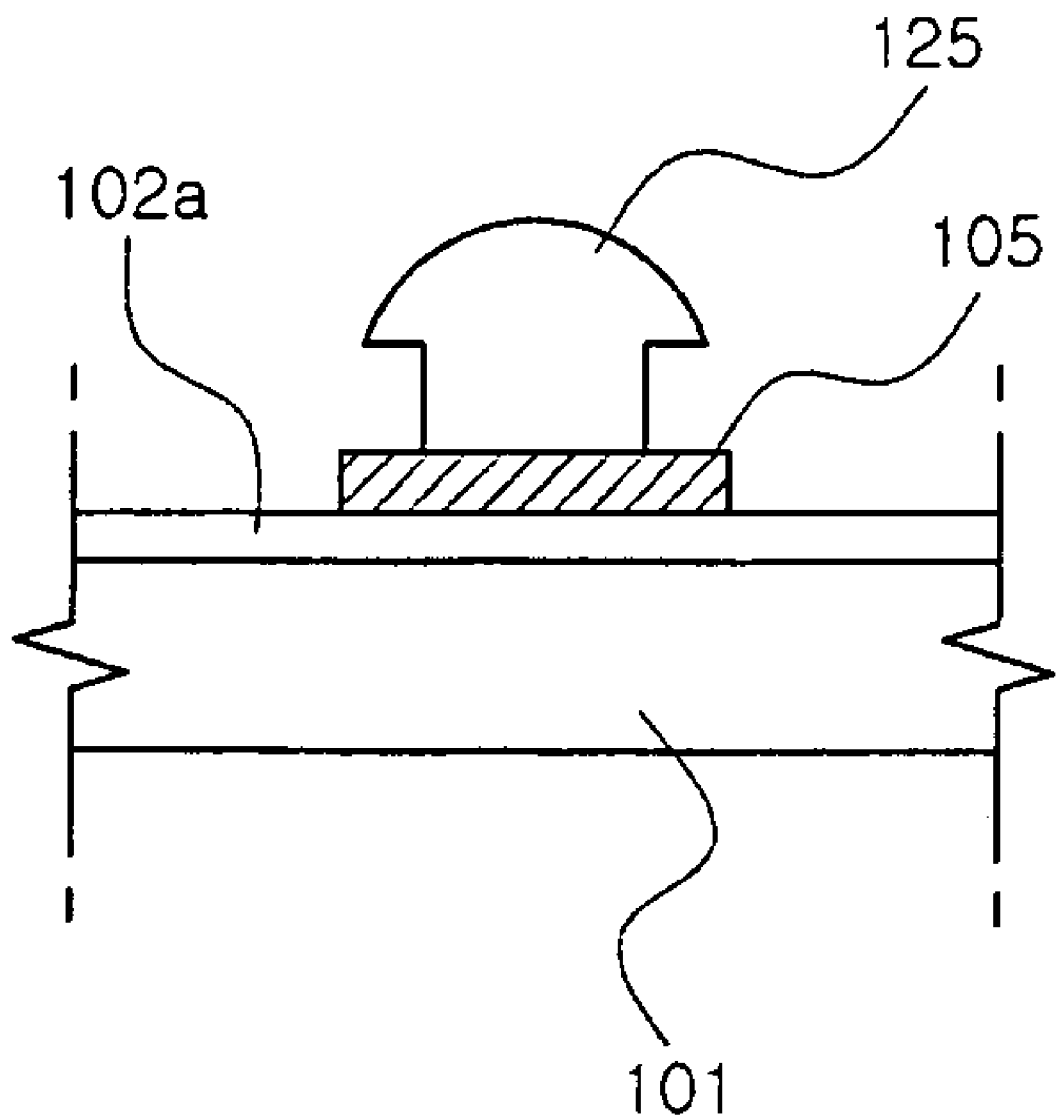
FIG. 4 is a cross-sectional view illustrating a backlight unit according to an another exemplary embodiment of the invention.

FIG. 4 is a partial magnified view illustrating a BLU according to another embodiment of the invention. In the embodiment of FIG. 4, a lower insulating layer (see reference numeral 102b of FIG. 2) is not formed. For example, a bottom of a chassis made of an aluminum material is masked with a resist and then anodized to form an insulating layer 102a, i.e., anodized oxide layer only on a top of the chassis 101. As described above, the insulating layer may not be formed on the bottom of the chassis. A circuit pattern 105 may be formed only on the top of the chassis 101, thus precluding a need for forming the insulating layer on the bottom of the chassis. That is, the insulating layer of a different material such as a polymer film may be formed on the top of the chassis 101.

Hereinafter, a method of manufacturing a BLU will be described according to an exemplary embodiment of the invention.

Figure 5A:
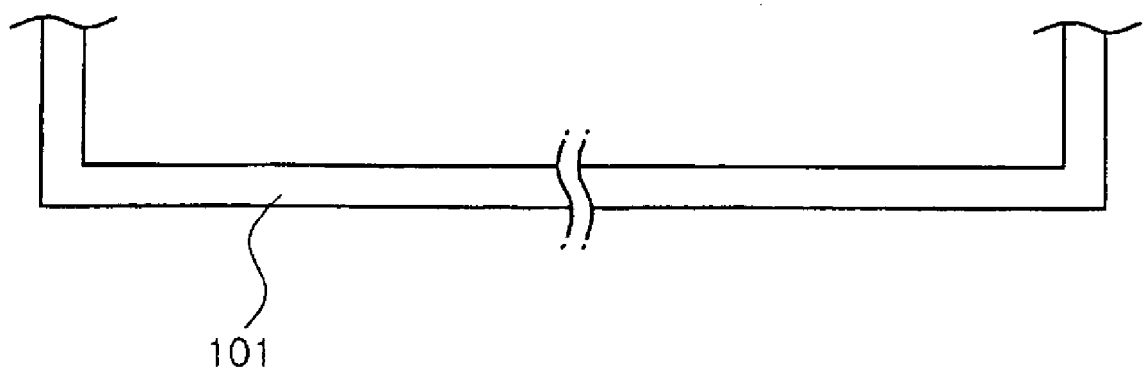
FIG. 5A to 5E are cross-sectional views for explaining a method of manufacturing a backlight unit according to an exemplary embodiment of the invention.
Figure 5B:
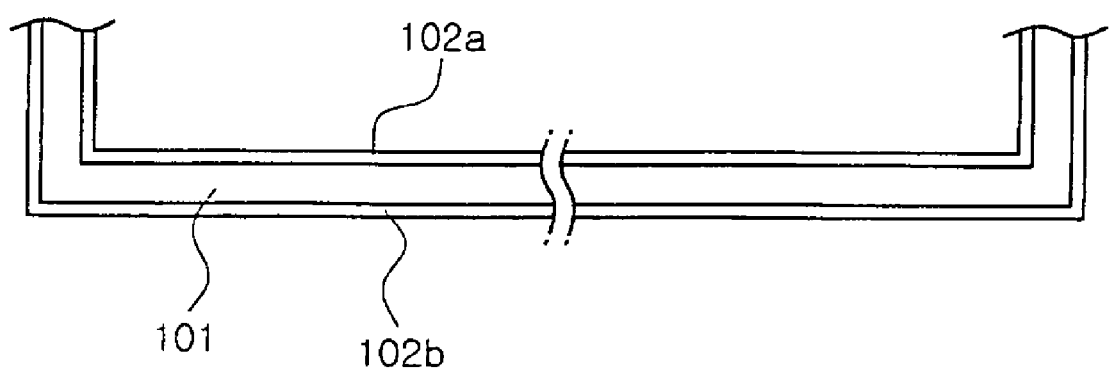

FIGS. 5A to 5B are cross-sectional views for explaining the method of manufacturing a backlight unit of the present embodiment. First, as shown in FIG. 5A, a chassis 101 made of Al or an Al alloy is provided. The chassis 101 maybe adequately bent to secure a space for seating a plurality of LEDs thereon.

Next, as shown in FIG. 5B, anodized aluminum oxide layers 102a and 102b are formed on a top and bottom of the chassis by anodizing aluminum. The anodization conditions such as anodization time, voltage and composition of an electrolyte used may be regulated to form the insulating layers, i.e., anodized oxide layers 102a and 102b to a desired thickness. In the anodization process, the bottom of the chassis where the circuit pattern does not need to be formed may be masked with an adequate insulator, e.g., resist film to form the anodized oxide layer only on the top of the chassis (see FIG. 4).

Figure 5C:
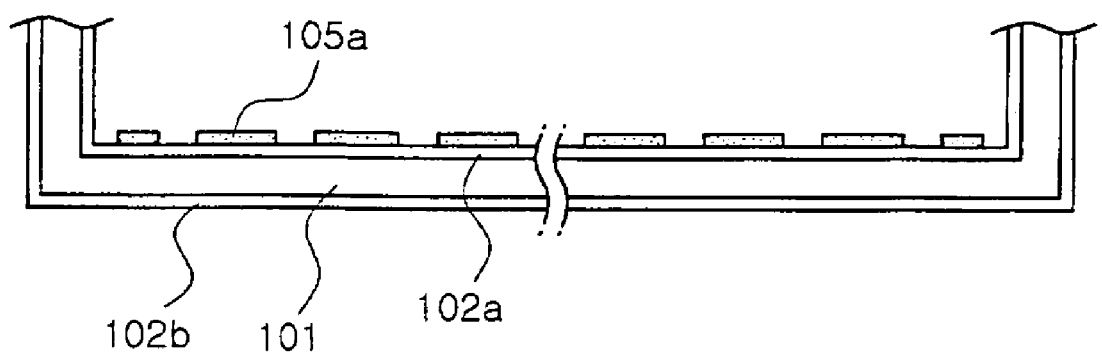
Figure 5D:
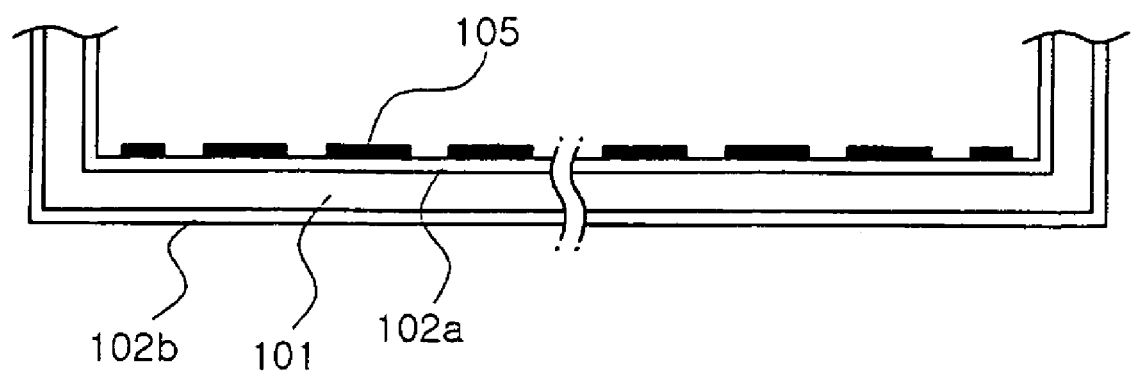

Thereafter, as shown in FIG. 5C, a silver paste 105a is applied on the anodized aluminum oxide layer 102a to form a circuit pattern. For example, the silver paste maybe applied to form the circuit pattern by one of screen printing and ink jet printing. The silver paste printed may contain a mixture of a silver powder and an organic material. Then, as shown in FIG. 5D, the silver paste is sintered to form a desired conductive circuit pattern 105.

Figure 5E:
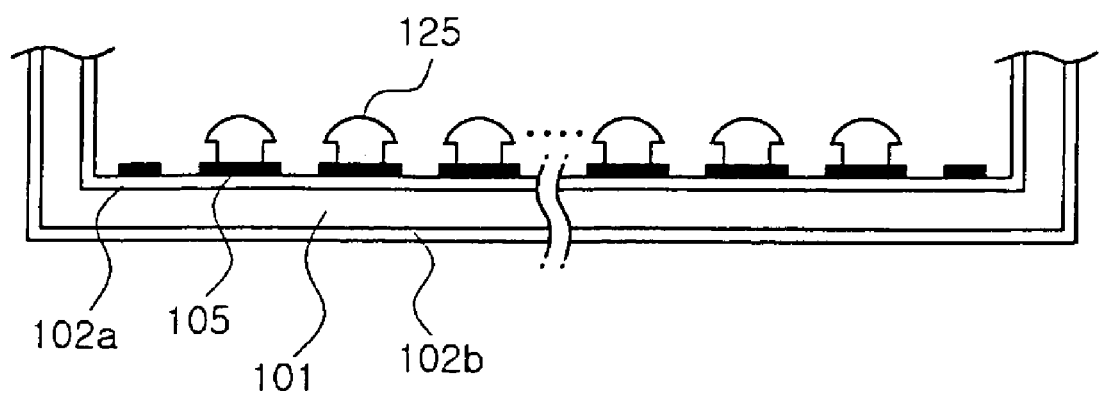

Subsequently, as shown in FIG. 5E, a plurality of LEDs or LED packages 125 are mounted on the anodized oxide layer 102a to connect to the circuit pattern 105. The plurality of LEDs 125 mounted may be white LEDs. For example, a blue GaN-based LED chip may be packaged with a light-transmitting resin containing a yellow phosphor (or red and green phosphors) into a white LED package to be mounted on the anodized oxide layer 102a. Alternatively, a near UV LED chip may be packaged with a light-transmitting resin containing blue, green and red phosphors into a white LED package to be mounted on the anodized oxide layer 102a. Alternatively, a blue LED chip or a near UV LED chip may be directly mounted on the anodized oxide layer 102a to form the circuit pattern 105, and then packaged with a resin containing a suitable phosphor or a mixture of phosphors. Also, the LEDs 125 may include a combination of blue, green and red LEDs.

The method of manufacturing the backlight unit of the present invention is not limited to the aforesaid embodiment shown in FIGS. 5A to 5E. The chassis may be made of other metal material in place of Al or an Al alloy. Also, the insulating layer may adopt a polymer film or a silicon oxide film in place of the anodized oxide layer. Moreover, the circuit pattern may be formed by other method in place of applying the silver paste by printing and sintering the silver paste. For example, to form the circuit pattern, the metal pattern may be formed directly on the insulating layer, or a metal layer (copper film) may be formed and then patterned.

The manufacturing method of the backlight unit precludes a need for employing structures such as PCBs, connectors, and screws or engaging units. The manufacturing method also eliminates an assembling process for attaching a gap pad or fixing the PCB for mounting the LEDs to the chassis by the screws. As a result, the manufacturing method is significantly simplified over the conventional manufacturing method, thereby reducing lead time and saving labor costs necessary for the assembling process. This eventually results in higher productivity in manufacturing the BLU. Furthermore, the conventional assembling process of the BLU requires considerable manual work. But according to the manufacturing method of the present embodiment, the BLU can be easily assembled through automation using an LED mounter and a reflow machine.

As set forth above, according to exemplary embodiments of the invention, a circuit pattern is formed directly on a chassis having an insulating layer formed on a top thereof, and LEDs are mounted on the circuit pattern. This obviates a need for additional parts such as PCBs, connectors and screws, thereby saving manufacturing costs. Also, this enhances radiation properties of heat generated from the LEDs. In the manufacturing method of the BLU, there is no need for assembling the PCBs. Thus, compared to the conventional method, the manufacturing method diminishes the number of processes required, boosts productivity of the BLUs and easily ensures the assembling process to be easily automated.

While the present invention has been shown and described in connection with the exemplary embodiments, it will be apparent to those skilled in the art that modifications and variations can be made without departing from the spirit and scope of the invention as defined by the appended claims.

What is claimed is:

1. A backlight unit comprising:
   a chassis having an insulating layer formed on a top of the chassis and another insulating layer formed on a bottom of the chassis;
   a circuit pattern formed on the insulating layer;
   a plurality of light emitting diodes formed on the insulating layer disposed on the top of the chassis to electrically connect to the circuit pattern,
   wherein the chassis has a structure to secure a space for seating the plurality of light emitting diodes thereon.

2. The backlight unit of claim 1, wherein the chassis is formed of one of aluminum and an aluminum alloy.

3. The backlight unit of claim 2, wherein the insulating layer is an aluminum anodized layer.

4. The backlight unit of claim 1, wherein the circuit pattern is formed of a material containing silver.

5. The backlight unit of claim 4, wherein the circuit pattern is formed of a sintered material of silver paste.

6. The backlight unit of claim 1, wherein the plurality of light emitting diodes comprise white light emitting diodes.

7. The backlight unit of claim 1, wherein the plurality of light emitting diodes comprise blue, green and red light emitting diodes.

8. A method of manufacturing a backlight unit, the method comprising:
   providing a chassis having a space thereon;
   forming insulating layers on a top and a bottom of the chassis, respectively;
   forming a circuit pattern on the insulating layer formed on the top of chassis; and
   mounting a plurality of light emitting diodes on the insulating layer disposed on the top of the chassis in the space to connect to the circuit pattern.

9. The method of claim 8, wherein the chassis is formed of one of aluminum and an aluminum alloy.

10. The method of claim 9, wherein the forming insulating layers on a top and a bottom of the chassis comprises anodizing the top and the bottom of the chassis to form aluminum anodized layers on the top and the bottom of the chassis, respectively.

11. The method of claim 8, wherein the forming a circuit pattern comprises:
    forming a silver paste on the insulating layer on the top of the chassis; and
    sintering the silver paste.

12. The method of claim 11, wherein the forming a silver paste comprises applying the silver paste on the insulating layer.

13. The method of claim 12, wherein the applying the silver paste on the insulating layer is performed by one of screen printing and ink jet printing.

* * * * *